US008809936B2

(12) United States Patent
Xue et al.

(10) Patent No.: US 8,809,936 B2
(45) Date of Patent: Aug. 19, 2014

(54) MEMORY CELL SYSTEM WITH MULTIPLE NITRIDE LAYERS

(75) Inventors: Lei Xue, Sunnyvale, CA (US); Rinji Sugino, San Jose, CA (US); YouSeok Suh, Cupertino, CA (US); Hidehiko Shiraiwa, San Jose, CA (US); Meng Ding, Sunnyvale, CA (US); Shenqing Fang, Fremont, CA (US); Joong Jeon, Los Altos, CA (US)

(73) Assignees: Globalfoundries Inc., Grand Cayman (KY); Spansion LLC, Sunnyvale, CA (US)

( * ) Notice: Subject to any disclaimer, the term of this patent is extended or adjusted under 35 U.S.C. 154(b) by 290 days.

(21) Appl. No.: 11/461,428

(22) Filed: Jul. 31, 2006

(65) Prior Publication Data
US 2008/0023750 A1 Jan. 31, 2008

(51) Int. Cl.
*H01L 29/788* (2006.01)

(52) U.S. Cl.
USPC .... 257/321; 257/324; 257/325; 257/E29.309; 438/261; 438/263

(58) Field of Classification Search
CPC .............. H01L 29/7883; H01L 29/792; H01L 21/28282; H01L 21/0251
USPC .......... 257/E29.309, 321, 324, 325; 438/261, 438/263
See application file for complete search history.

(56) References Cited

U.S. PATENT DOCUMENTS

| | | | |
|---|---|---|---|
| 4,630,086 A * | 12/1986 | Sato et al. | 365/185.06 |
| 5,739,569 A * | 4/1998 | Chen | 257/321 |
| 6,440,797 B1 | 8/2002 | Wu et al. | |
| 6,680,509 B1 * | 1/2004 | Wu et al. | 257/324 |
| 6,709,928 B1 | 3/2004 | Jenne et al. | |
| 6,897,149 B2 | 5/2005 | Sugawara et al. | |
| 6,933,218 B1 | 8/2005 | Lee et al. | |
| 7,042,045 B2 | 5/2006 | Kang et al. | |
| 7,045,854 B2 | 5/2006 | Osabe et al. | |
| 2002/0063277 A1 | 5/2002 | Ramsbey et al. | |
| 2003/0122204 A1 * | 7/2003 | Nomoto et al. | 257/406 |
| 2003/0153150 A1 * | 8/2003 | Dong et al. | 438/257 |
| 2004/0175961 A1 | 9/2004 | Olsen | |
| 2004/0251489 A1 * | 12/2004 | Jeon et al. | 257/315 |
| 2004/0251521 A1 * | 12/2004 | Tanaka et al. | 257/639 |
| 2005/0199944 A1 * | 9/2005 | Chen et al. | 257/324 |
| 2005/0230766 A1 * | 10/2005 | Nomoto et al. | 257/411 |
| 2005/0285184 A1 | 12/2005 | Jung | |
| 2006/0008997 A1 * | 1/2006 | Jang et al. | 438/287 |
| 2006/0197141 A1 * | 9/2006 | Ufert et al. | 257/315 |
| 2006/0261401 A1 * | 11/2006 | Bhattacharyya | 257/316 |

FOREIGN PATENT DOCUMENTS

| | | |
|---|---|---|
| TW | 478115 | 3/2002 |
| TW | 200404339 | 3/2004 |
| TW | 200644172 | 12/2006 |

* cited by examiner

*Primary Examiner* — Peniel M Gumedzoe
(74) *Attorney, Agent, or Firm* — Farajami & Farajami LLP

(57) ABSTRACT

A memory cell system is provided including forming a first insulator layer over a semiconductor substrate, forming a charge trap layer over the first insulator layer, forming a second insulator layer over the charge trap layer, forming a top blocking intermediate layer over the second insulator layer, and forming a contact layer over the top blocking intermediate layer.

18 Claims, 5 Drawing Sheets

MEMORY CELL SYSTEM WITH MULTIPLE NITRIDE LAYERS

TECHNICAL FIELD

The present invention relates generally to memory system and more particularly to non-volatile memory system.

BACKGROUND ART

Modern electronics, such as smart phones, personal digital assistants, location based services devices, digital cameras, music players, servers, and storage arrays, are packing more integrated circuits into an ever shrinking physical space with expectations for decreasing cost. One cornerstone for electronics to continue proliferation into everyday life is the non-volatile storage of information such as cellular phone numbers, digital pictures, or music files. Numerous technologies have been developed to meet these requirements.

Various types of non-volatile memories have been developed including electrically erasable programmable read only memory (EEPROM) and electrically programmable read only memory (EPROM). Each type of memory had advantages and disadvantages. EEPROM can be easily erased without extra exterior equipment but with reduced data storage density, lower speed, and higher cost. EPROM, in contrast, is less expensive and has greater density but lacks erasability.

A newer type of memory called "Flash" EEPROM, or Flash memory, has become popular because it combines the advantages of the high density and low cost of EPROM with the electrical erasability of EEPROM. Flash memory can be rewritten and can hold its contents without power. Contemporary Flash memories are designed in a floating gate or a charge trapping architecture. Each architecture has its advantages and disadvantages.

The floating gate architecture offers implementation simplicity. This architecture embeds a gate structure, called a floating gate, inside a conventional metal oxide semiconductor (MOS) transistor gate stack. Electrons can be injected and stored in the floating gate as well as erased using an electrical field or ultraviolet light. The stored information may be interpreted as a value "0" or "1" from the threshold voltage value depending upon charge stored in the floating gate. As the demand for Flash memories increases, the Flash memories must scale with new semiconductor processes. However, new semiconductor process causes a reduction of key feature sizes in Flash memories of the floating gate architecture which results in undesired increase in programming time and decrease in data retention.

The charge trapping architecture offers improved scalability to new semiconductor processes compared to the floating gate architecture. One implementation of the charge trapping architecture is a silicon-oxide-nitride-oxide semiconductor (SONOS) where the charge is trapped in the nitride layer. Charge-trapping efficiency determines if the memory devices can keep enough charges in the storage nodes after programming operation and is reflected in data retention characteristics. Fowler-Nordheim electron tunneling is a desirable method for erase operation over hole direct tunneling which requires a very thin tunnel oxide, causing poor data retention.

During Fowler-Nordheim erase operation, electrons can also tunnel from gate into the charge trapping layer through the top oxide. This phenomenon is often called back-gate injection. SONOS Flash memories suffer from poor Fowler-Nordheim erase performance due to back-gate injection. Silicon content in the nitride layer improves the erasing performance but offers poor data retention. Moreover, the interface between the charge trapping layer with the bottom tunneling oxide layer present both scaling and functional challenges despite the silicon content as well as add cost to the manufacturing process.

Thus, a need still remains for a memory cell system providing low cost manufacturing, improved yields, improved erasing performance, and improved data retention of memory in a system. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a memory cell system including forming a first insulator layer over a semiconductor substrate, forming a charge trap layer over the first insulator layer, forming a second insulator layer over the charge trap layer, forming a top blocking intermediate layer over the second insulator layer, and forming a contact layer over the top blocking intermediate layer.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
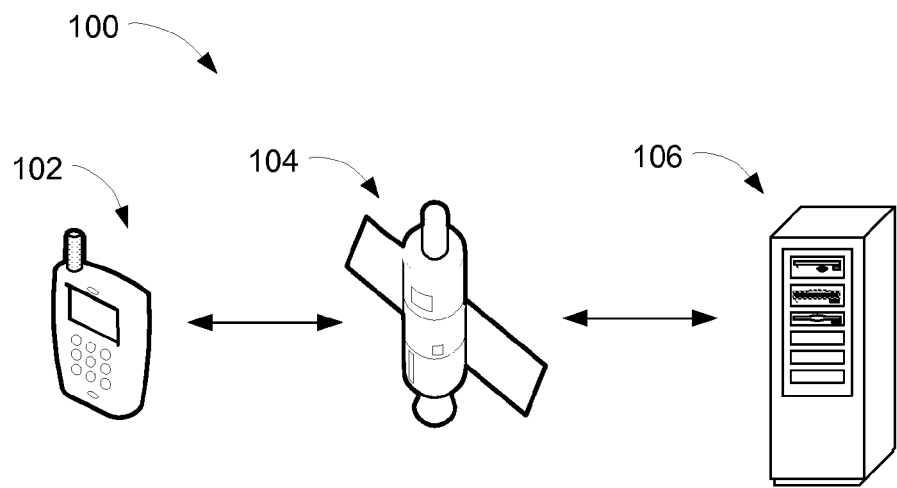
FIG. 1 is schematic views of examples of electronics systems in which various aspects of the present invention may be implemented.

In the following description, numerous specific details are given to provide a thorough understanding of the invention.

However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional integrated circuit surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements.

The term "processing" as used herein includes deposition of material, patterning, exposure, development, etching, cleaning, molding, and/or removal of the material or as required in forming a described structure.

Referring now to FIG. 1, therein is shown schematic views of examples of electronics systems 100 in which various aspects of the present invention may be implemented. A smart phone 102, a satellite 104, and a compute system 106 are examples of the electronic systems 100 using the present invention. The electronic systems 100 may be any system that performs any function for the creation, transportation, storage, and consumption of information. For example, the smart phone 102 may create information by transmitting voice to the satellite 104. The satellite 104 is used to transport the information to the compute system 106. The compute system 106 may be used to store the information. The smart phone 102 may also consume information sent from the satellite 104.

Figure 2:
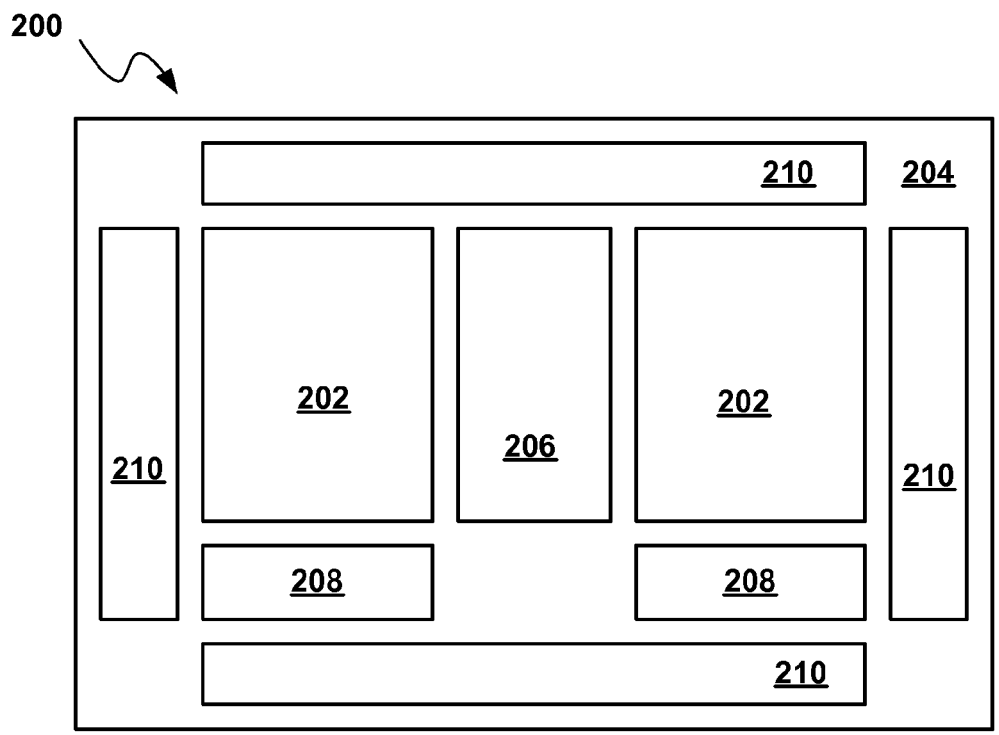
FIG. 2 is a plan view of a device in which various aspects of the present invention may be implemented.

Referring now to FIG. 2, therein is shown a plan view of a device 200 in which various aspects of the present invention may be implemented. The device 200 is a semiconductor device including memory systems 202 having the present invention. The device 200 commonly includes a semiconductor substrate 204 in which one or more high-density core regions and one or more low-density peripheral portions are formed.

High-density core regions typically include one or more of the memory systems 202. Low-density peripheral portions typically include input/output (I/O) circuitry and programming circuitry for individually and selectively addressing a location in each of the memory systems 202. The programming circuitry is represented in part by and includes one or more x-decoders 206 and y-decoders 208, cooperating with I/O circuitry 210 for connecting the source, gate, and drain of selected addressed memory cells to predetermined voltages or impedances to effect designated operations on the memory cell, e.g., programming, reading, and erasing, and deriving necessary voltages to effect such operations.

For illustrative purposes, the device 200 is shown as a memory device, although it is understood that the device 200 may other semiconductor devices having other functional blocks, such as a digital logic block, a processor, or other types of memories. Also for illustrative purposes, the device 200 is described as a single type of semiconductor device, although it is understood that the device 200 may be a multichip module utilizing the present invention with other types of devices of similar or different semiconductor technologies, such as power devices or microelectromechanical systems (MEMS). Further for illustrative purposes, the device 200 is described as a semiconductor device, although it is understood that the device 200 may be a board level product including the present invention.

Figure 3:
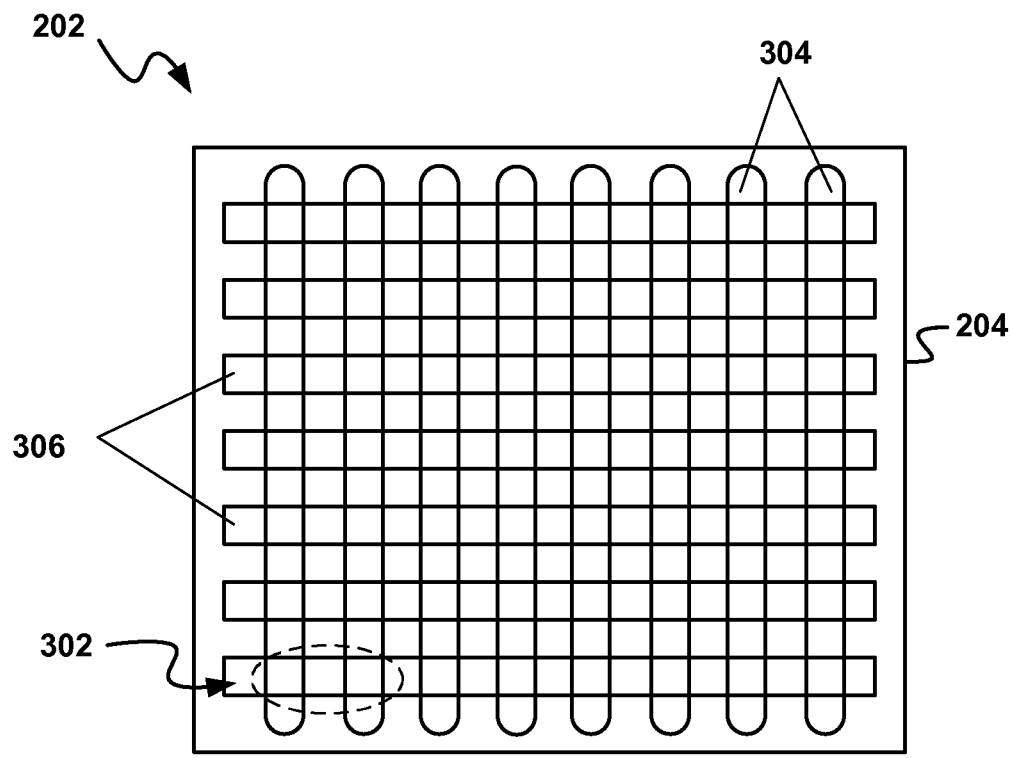
FIG. 3 is a plan view of a portion of the memory systems in which various aspects of the present invention may be implemented.

Referring now to FIG. 3, therein is shown a plan view of a portion of the memory systems 202 in which various aspects of the present invention may be implemented. The memory systems 202 have M×N arrays of a memory cell system 302. The semiconductor substrate 204 has a plurality of bit lines 304 extending in parallel with a plurality of word lines 306 extending in parallel and at right angles to the plurality of the bit lines 304. The word lines 306 and the bit lines 304 have contacts and interconnections (not shown) to the programming circuitry discussed in FIG. 2.

Figure 4:
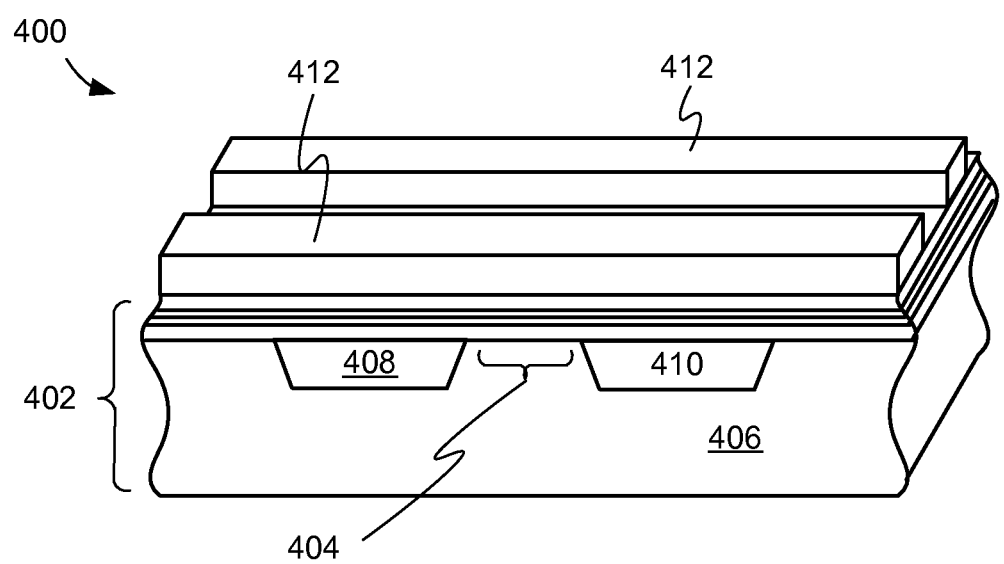
FIG. 4 is a cross-sectional isometric view of a memory cell system in an embodiment of the present invention.

Referring now to FIG. 4, therein is shown a cross-sectional isometric view of a memory cell system 400 in an embodiment of the present invention. The memory cell system 400 may represent the memory cell system 302 of FIG. 3. The memory cell system 400 includes a memory cell stack 402 including a charge storage region 404 for storing an electrical charge, such as electrons. For illustrative purposes, the memory cell system 400 is shown having one of the charge storage region 404 for storing electrical charges, although it is understood that any number of the charge storage regions maybe provided, as well. It is also understood that the charge storage region 404 may provide storage for any number of electrical charges.

The memory cell stack 402 also includes a semiconductor substrate 406, such as a p-type substrate, having a first region 408, such as an n-type region, and a second region 410, such as an n-type region. The first region 408 may be a source and the second region 410 may be the drain or vice versa. Depending on the overall memory array connection with the memory cell system 400, the first region 408, the second region 410, or both may connect to the bit lines 304 of FIG. 3 providing access in to the memory cell system 400 for decoding processes, such as reading, programming and erasing. The memory cell system 400 also includes word lines 412, such as polysilicon, n-type polysilicon, or metal, acting as control gates in cooperation with the bit lines 304 for the decoding processes, such as reading, programming and erasing. Depending upon a signal on the word lines 412 and the connection of the bit lines 304 to an electrical source or drain, the memory cell system 400 may read, program or erase the charge storage region 404.

Figure 5:
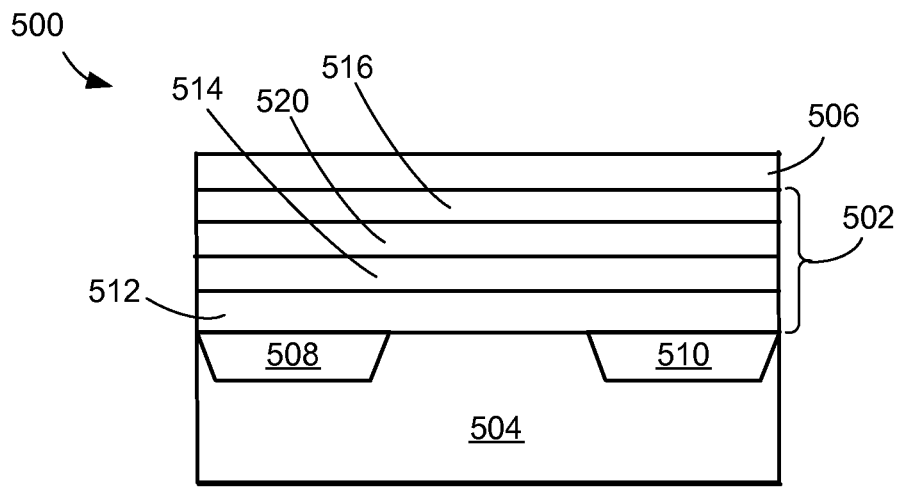
FIG. 5 is a more detailed cross-sectional view of a memory cell stack in an embodiment of the present invention.

Referring now to FIG. 5, therein is shown a cross-sectional view of a memory cell stack 500 in an embodiment of the present invention. The memory cell stack 500 may represent the memory cell stack 402 of FIG. 4. The memory cell stack 500 includes a charge-storage stack 502 on a semiconductor substrate 504, such as a p-type silicon substrate. A semiconductor gate 506, such as a polysilicon, n-type polysilicon, or p-type polysilicon, is on the charge-storage stack 502.

The charge-storage stack 502 provides a region between a first region 508, such as an n-type region, and a second region 510, such as an n-type region, for storage of electrical charges. The semiconductor substrate 504 and the semiconductor gate 506 provide access for reading and erasing storage locations of the electrical charges.

The charge-storage stack 502 has multiple layers. A first insulator layer 512, such as a bottom tunneling oxide layer of silicon dioxide ($SiO_2$), of the charge-storage stack 502 is over the semiconductor substrate 504. A charge trap layer 514 of the charge-storage stack 502 is over the first insulator layer 512. The charge trap layer 514 provides regions for storage of the electrical charges. The charge trap layer 514 includes a charge trapping material, such as a silicon rich nitride (SRN or SiRN) or silicon nitride ($Si_xN_y$). A second insulator layer 520, such as a top blocking oxide layer of silicon dioxide ($SiO_2$), of the charge-storage stack 502 is over the charge trap layer 514. The charge-storage stack 502 also includes a top blocking intermediate layer 516, such as a blocking nitride layer, over the second insulator layer 520.

For illustrative purposes, the charge trap layer 514 is shown as having one layer of charge trapping material, although it is understood that the number layers may differ. Also for illustrative purpose, the layers in the charge-storage stack 502 is shown as stratified, although it is understood that the layers may not be stratified but form a gradient of similar material with difference concentrations, such as silicon or nitride concentration difference from bottom to the top of the charge-storage stack 502.

For the memory cell system 400 of FIG. 4, erase and charge-trapping efficiency are two major parameters considered in memory system (not shown) performance evaluation. Charge-trapping efficiency determines if the memory devices can keep enough charges in the charge trap layer 514 after programming operation and is reflected in data retention characteristics.

During Fowler-Nordheim erase operation, electrons can also tunnel from gate into the charge trapping layer through the top oxide. This undesirable phenomenon is often called back-gate injection. Back-gate injection slows down erase speed and causes early erase saturation. The charge-trapping efficiency is proportional to relative silicon content ratio in nitride layer. The increased silicon content increases electron mobility in the charge trap layer 514. The increased silicon content improves erase speed to some extent but data retention often suffers. The increased silicon content can neither eliminate back-gate injection nor improves erase saturation.

It has been discovered that the top blocking intermediate layer 516 over the second insulator layer 520 reduces the back gate injection to improve the Fowler-Nordheim erase speed and erase saturation. The top blocking intermediate layer 516 increases electron tunneling barrier height and lowers electric field in the top blocking intermediate layer 516 compared to the second insulator layer 520 during erase operation. As a result, Fowler-Nordheim erase speed can be improved by orders of magnitude and erase saturation voltage can be lowered, such as lowered by a few volts.

It has been also discovered that for the semiconductor gate 506 as a p-type polysilicon gate, the top blocking intermediate layer 516 over the second insulator layer 520 acts as a boron diffusion barrier and prevents boron penetration from the semiconductor gate 506 into the semiconductor substrate 504.

Figure 6:
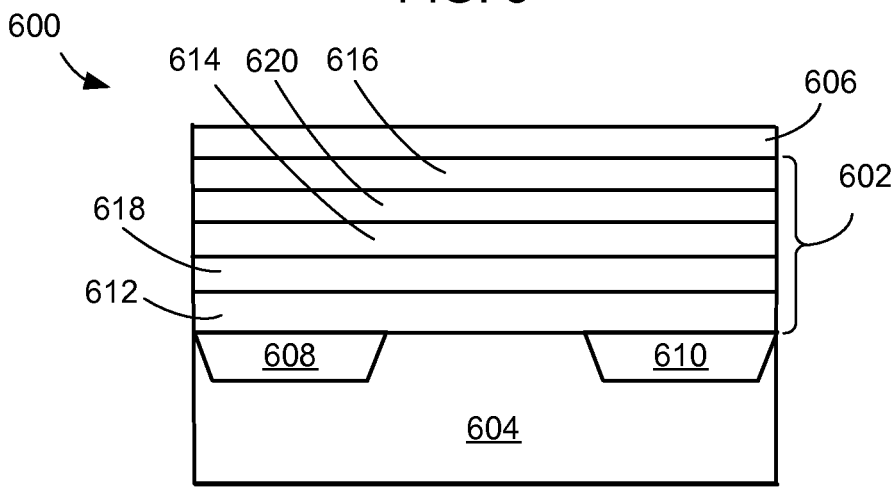
FIG. 6 is a more detailed cross-sectional view of a memory cell stack in an alternative embodiment of the present invention.

Referring now to FIG. 6, therein is shown a more detailed cross-sectional view of a memory cell stack 600 in an alternative embodiment of the present invention. The memory cell stack 600 may represent the memory cell stack 402 of FIG. 4. The memory cell stack 600 includes a charge-storage stack 602 on a semiconductor substrate 604, such as a p-type silicon substrate. A semiconductor gate 606, such as a polysilicon, n-type polysilicon, or p-type polysilicon, is on the charge-storage stack 602.

The charge-storage stack 602 provides a region between a first region 608, such as an n-type region, and a second region 610, such as an n-type region, for storage of electrical charges. The semiconductor substrate 604 and the semiconductor gate 606 provide access for reading and erasing storage locations of the electrical charges.

The charge-storage stack 602 has multiple layers. A first insulator layer 612, such as a bottom tunneling oxide layer of silicon dioxide ($SiO_2$), of the charge-storage stack 602 is over the semiconductor substrate 604. A bottom blocking intermediate layer 618, such as a bottom nitride layer, is over the first insulator layer 612. A charge trap layer 614 of the charge-storage stack 602 is over the bottom blocking intermediate layer 618. The charge trap layer 614 provides regions for storage of the electrical charges. The charge trap layer 614 includes a charge trapping material, such as a silicon rich nitride (SRN or SiRN) or silicon nitride ($Si_xN_y$). A second insulator layer 620, such as a top blocking oxide layer of silicon dioxide ($SiO_2$), of the charge-storage stack 602 is over the charge trap layer 614. The charge-storage stack 602 also includes a top blocking intermediate layer 616, such as a blocking nitride layer, over the second insulator layer 620.

For illustrative purposes, the charge trap layer 614 is shown as having one layer of charge trapping material, although it is understood that the number layers may differ. Also for illustrative purpose, the layers in the charge-storage stack 602 is shown as stratified, although it is understood that the layers may not be stratified but form a gradient of similar material with difference concentrations, such as silicon or nitride concentration difference from bottom to the top of the charge-storage stack 602.

For the memory cell system 400 of FIG. 4, erase and charge-trapping efficiency are two major parameters considered in memory system (not shown) performance evaluation. Charge-trapping efficiency determines if the memory devices can keep enough charges in the charge trap layer 614 after programming operation and is reflected in data retention characteristics.

Back-gate injection slows down erase speed and causes early erase saturation. The charge-trapping efficiency is proportional to relative silicon content ratio in nitride layer. The increased silicon content increases electron mobility in the charge trap layer 614. It improves the erase speed to some extent but data retention often suffers. Although silicon content plays an important role in charge-trapping efficiency, it does not have same constructive effect on leakage characteristics. It prevents further scaling of the first insulator layer 612 due to increased cycled charge loss caused by more mobile charges stored in the charge trap layer 614.

It has been discovered that the bottom blocking intermediate layer 618 over the first insulator layer 612 improves data retention performance. The insertion of the bottom blocking intermediate layer 618 over the first insulator layer 612 improves interface properties and the sub-threshold slope degradation during cycling to reduce cycled charge loss through the first insulator layer 612. A few volts of improvement, measured by threshold voltage change due to cycled charge loss, can be achieved.

It has been also discovered that for the semiconductor gate 606 as a p-type polysilicon gate, the bottom blocking intermediate layer 618 over the first insulator layer 612 acts as an additional boron diffusion barrier and suppresses boron penetration from the semiconductor gate 606 into the semiconductor substrate 604.

Figure 7:
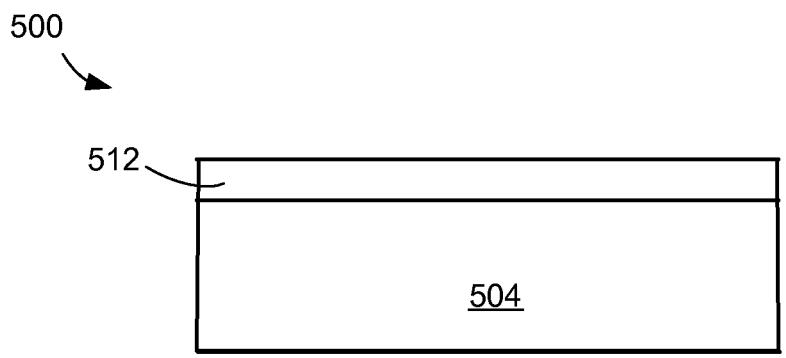
FIG. 7 is a more detailed cross-sectional view of the memory cell stack of FIG. 5 in a formation phase of the first insulator layer.

Referring now to FIG. 7, therein is shown a more detailed cross-sectional view of the memory cell stack 500 of FIG. 5 in a formation phase of the first insulator layer 512. This more detailed cross-sectional view depicts the memory cell stack 500 between the first region 508 of FIG. 5 and the second region 510 of FIG. 5. The first insulator layer 512 is formed on the semiconductor substrate 504. The first insulator layer 512 may be formed by any number of processes, such as thermal oxidation.

Figure 8:
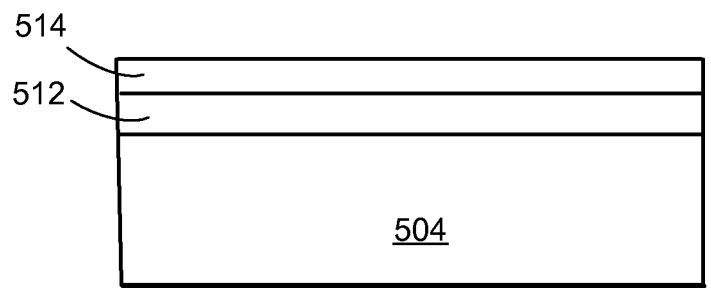
FIG. 8 is a cross-sectional view of the structure of FIG. 7 in a formation phase of the charge trap layer.

Referring now to FIG. 8, therein is shown a cross-sectional view of the structure of FIG. 7 in a formation phase of the charge trap layer 514. The silicon rich nitride (SiRN) of the charge trap layer 514 is deposited on the first insulator layer 512 and over the semiconductor substrate 504.

The silicon-rich nitride may be formed by a chemical vapor deposition process (CVD) wherein two types of gases, such as $NH_3$ and $SiH_4$, interact during the deposition of the silicon-rich nitride. A ratio of the gases, such as $NH_3$:$SiH_4$, is below approximately 360:60, but higher than approximately 53:330, to be considered silicon-rich nitride for storing two or more bits. The silicon-rich nitride may include a higher ratio, such as 28:360, to provide conductivity for single bit storage.

Figure 9:
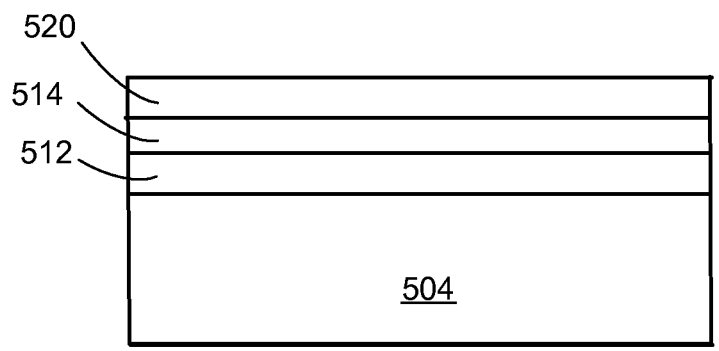
FIG. 9 is a cross-sectional view of the structure of FIG. 8 in a formation phase of the second insulator layer.

Referring now to FIG. 9, therein is shown a cross-sectional view of the structure of FIG. 8 in a formation phase of the second insulator layer 520. The second insulator layer 520 may be deposited on the charge trap layer 514 by any number of processes, such as atomic layer deposition (ALD). Alternatively, a top portion of the charge trap layer 514 may undergo oxidation by any number of processes, such as steam oxidation or slot plane antenna (SPA) plasma technique, to form the second insulator layer 520, as the top blocking oxide layer, from the upper portion of the silicon-rich nitride or regular silicon nitride layer of the charge trap layer 514. The second insulator layer 520 is also over the first insulator layer 512 and the semiconductor substrate 504.

Figure 10:
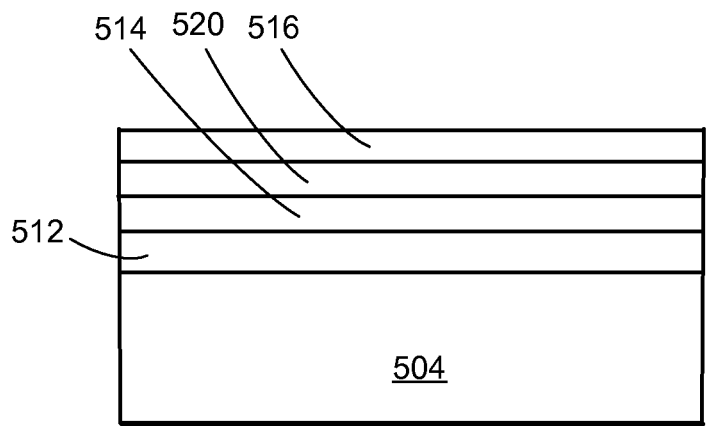
FIG. 10 is a cross-sectional view of the structure of FIG. 9 in a formation phase of the top blocking intermediate layer.
Figure 11:
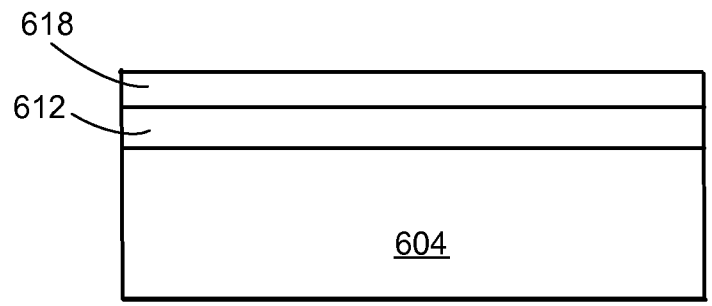
FIG. 11 is a cross-sectional view of the memory cell stack of FIG. 6 in a formation phase the bottom blocking intermediate layer.

Referring now to FIG. 10, therein is shown a cross-sectional view of the structure of FIG. 9 in a formation phase of the top blocking intermediate layer 516. The top blocking intermediate layer 516 may be deposited on the second insulator layer 520 by any number of processes, such as atomic level deposition. Alternatively, a top portion of the second insulator layer 520 may undergo nitridation by any number of processes, such as slot plane antenna plasma nitridation or decoupled plasma nitridation (DPN). The top blocking intermediate layer 516 is over the charge trap layer 514, the first insulator layer 512, and the semiconductor substrate 504.

Program and erase voltages are proportional to the equivalent oxide thickness (EOT) of the memory cell stack 500 or also referred to as the gate stack. A thinner EOT minimizes voltage requirement for the memory system 202 of FIG. 3. SPA, DPN, or ALD provide accurate thickness control from a few angstroms to tens of angstroms for ultra-thin nitride layer or film for the top blocking intermediate layer 516. The top blocking intermediate layer 516 minimally increases the EOT.

Referring now to FIG. 1, therein is shown a cross-sectional view of the memory cell stack 600 of FIG. 6 in a formation phase the bottom blocking intermediate layer 618. Alternatively, the bottom blocking intermediate layer 618 may be formed on the first insulator layer 612 following a phase similar to that described in FIG. 7 and before a phase similar to FIG. 8. The manufacture of the memory cell stack 600 may continue similarly as described from FIG. 8 to FIG. 10. The bottom blocking intermediate layer 618 may be deposited on the first insulator layer 612 by any number of processes, such as atomic level deposition. Alternatively, a top portion of the first insulator layer 612 may undergo nitridation by any number of processes, such as slot plane antenna plasma nitridation or decoupled plasma nitridation. The bottom blocking intermediate layer 618 is also above the semiconductor substrate 604.

Figure 12:
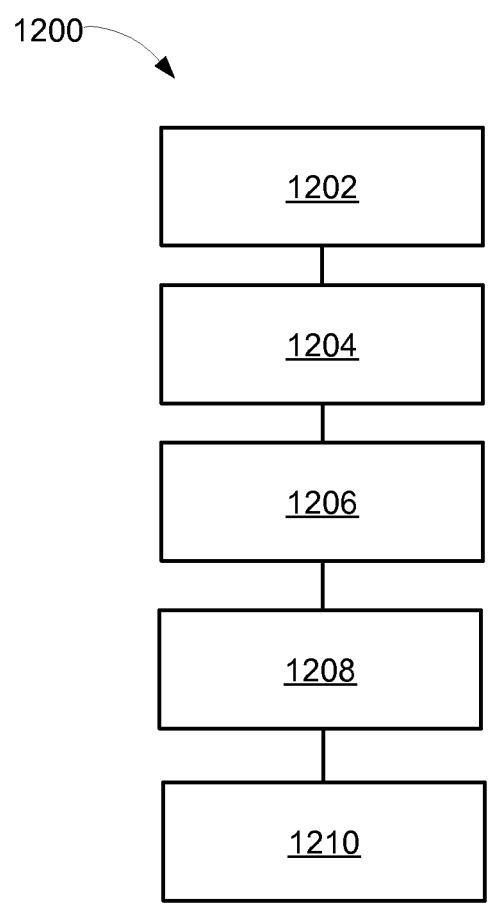
FIG. 12 is a flow chart of a memory cell system for the manufacture of the memory cell system in an embodiment of the present invention.

Referring now to FIG. 12, therein is shown a flow chart of a memory cell system 1200 for manufacture of the memory cell system 400 in an embodiment of the present invention. The system 1200 includes forming a first insulator layer over a semiconductor substrate in a block 1202; forming a charge trap layer over the first insulator layer in a block 1204; forming a second insulator layer over the charge trap layer in a block 1206; forming a top blocking intermediate layer over the second insulator layer in a block 1208; and forming a contact layer over the top blocking intermediate layer in a block 1210.

It has been discovered that the present invention thus has numerous aspects.

It has been discovered that the present invention has improved erase performance and data retention. A top nitride blocking layer over the top blocking oxide layer and below the gate polysilicon improves the erase performance. The present invention provides additional performance improvements with a bottom nitride layer over the bottom tunneling oxide layer and below the charge trap layer.

An aspect of the present invention is that the top blocking nitride layer above the top blocking oxide layer and below the gate polysilicon reduces the back gate injection to improve erase speed and saturation. For a p-type gate polysilicon, the top blocking nitride layer and the bottom blocking nitride layer reduce boron penetration from the p-type gate polysilicon to the semiconductor substrate.

Another aspect of the present invention is that the bottom blocking nitride layer above the bottom tunneling oxide layer and below the charge trap layer reduces cycled charge loss to improve data retention.

Yet another aspect of the present invention provides deposition or nitridation process for control of the top blocking nitride layer and the bottom blocking nitride layer thereby minimally affecting the equivalent oxide thickness (EOT).

Yet another aspect of the present invention eliminates manufacturing steps such as thermal oxidation process and the high temperature nitridation process. These high temperatures add thermal budget and cost.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the memory cell system method and apparatus of the present invention furnish important and heretofore unknown and unavailable solutions, capabilities, and functional aspects for memory systems. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hitherto set forth herein or shown in the accompanying drawings are to be interpreted in an illustrative and non-limiting sense.

What is claimed is:

1. A method for fabricating memory cells, said method comprising:
   forming a charge storage stack on a semiconductor substrate by depositing a blocking oxide layer on a charge trap layer formed over a tunneling oxide layer;
   nitriding a top surface of said blocking oxide layer; and
   forming a semiconductor gate on said nitrided top surface of said blocking oxide layer;

wherein a silicon concentration of said charge storage stack including said tunneling oxide layer, said charge trap layer, and said blocking oxide layer is graded from a bottom surface to a top surface of said charge storage stack.

2. The method of claim 1, further comprising:
forming a bottom blocking intermediate layer over said tunneling oxide layer and below said charge trap layer.

3. The method of claim 1, wherein said nitriding said top surface of said blocking oxide layer results in formation of a top blocking intermediate layer on said top surface of said blocking oxide layer.

4. The method of claim 1, wherein said nitriding said top surface of said blocking oxide layer reduces back gate injection from said semiconductor gate to said charge trap layer.

5. The method of claim 1, wherein said nitriding said top surface of said blocking oxide layer is performed by one of slot plane antenna (SPA) plasma nitridation and decoupled plasma nitridation (DPN).

6. The method of claim 1, wherein said formation of said charge storage stack results in a memory cell stack charging and discharging substantially by Fowler-Nordheim tunneling.

7. The method of claim 1, further comprising:
forming a memory system from said memory cells; and
interconnecting said memory cells with a plurality of bit lines and a plurality of word lines.

8. A method for fabricating memory cells, said method comprising:
forming a charge storage stack on a semiconductor substrate by depositing a trap nitride layer on a bottom blocking intermediate layer formed over a first insulating layer;
forming a second insulating layer on said trap nitride layer;
nitriding a top surface of said second insulating layer; and
forming a semiconductor gate on said nitrided top surface of said second insulating layer;
wherein a silicon concentration of said charge storage stack including said first insulating layer, said bottom blocking intermediate layer, said trap nitride layer, and said second insulating layer is graded from a bottom surface to a top surface of said charge storage stack.

9. The method of claim 8, wherein said bottom blocking intermediate layer is formed by nitriding a top surface of said first insulating layer or depositing a nitride on said first insulating layer.

10. The method of claim 8, wherein said nitriding said top surface of said second insulating layer results in formation of a top blocking intermediate layer on said top surface of said second insulating layer.

11. The method of claim 8, wherein said nitriding said top surface of said blocking oxide layer reduces back gate injection from said semiconductor gate to said charge trap layer.

12. The method of claim 8, wherein said nitriding said top surface of said second insulating layer is performed by one of slot plane antenna (SPA) plasma nitridation and decoupled plasma nitridation (DPN).

13. The method of claim 8, wherein said formation of said charge storage stack results in a memory cell stack charging and discharging substantially by Fowler-Nordheim tunneling.

14. The method of claim 8, further comprising:
forming a memory system from said memory cells; and
interconnecting said memory cells with a plurality of bit lines and a plurality of word lines.

15. A memory cell comprising:
a charge storage stack disposed on a semiconductor substrate, said charge storage stack comprising:
a charge trap layer over a tunneling oxide layer;
a blocking oxide layer over said charge trap layer; and
a top blocking intermediate layer over said blocking oxide layer, said top blocking intermediate layer formed by nitriding a top portion of said blocking oxide layer; and
a semiconductor gate on said top blocking intermediate layer;
wherein a silicon concentration of said charge storage stack including said tunneling oxide layer, said charge trap layer, said blocking oxide layer, and said top blocking intermediate layer is graded from a bottom surface to a top surface of said charge storage stack.

16. The memory cell of claim 15, further comprising:
a bottom blocking intermediate layer over said tunneling oxide layer and below said charge trap layer.

17. The memory cell of claim 15, wherein said semiconductor gate is comprised of polysilicon.

18. The memory cell of claim 15, wherein said charge trap layer is comprised of silicon nitride.

* * * * *